US007557523B2

United States Patent
Goriki et al.

(10) Patent No.: US 7,557,523 B2
(45) Date of Patent: Jul. 7, 2009

(54) DISCHARGE LAMP LIGHTING DEVICE, AND LIGHTING EQUIPMENT AND LIGHTING SYSTEM USING THE DEVICE

(75) Inventors: Takeshi Goriki, Kyoto (JP); Koji Noro, Osaka (JP); Noriyuki Fukumori, Kyoto (JP); Kenichi Fukuda, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 25 days.

(21) Appl. No.: 11/577,891

(22) PCT Filed: Sep. 16, 2005

(86) PCT No.: PCT/JP2005/017167

§ 371 (c)(1),
(2), (4) Date: Jun. 28, 2007

(87) PCT Pub. No.: WO2006/046364

PCT Pub. Date: May 4, 2006

(65) Prior Publication Data

US 2008/0030143 A1 Feb. 7, 2008

(30) Foreign Application Priority Data

Oct. 26, 2004 (JP) ............................. 2004-311499

(51) Int. Cl.
*H05B 41/36* (2006.01)
(52) U.S. Cl. .................. 315/308; 315/291; 315/360; 315/224; 315/209 R; 324/677; 324/679; 320/166
(58) Field of Classification Search ............. 315/209 R, 315/219, 225, 247, 224, 291, 307, 308, 360, 315/362, 289, DIG. 5; 324/677–679; 307/48, 307/66; 320/135, 166, 167
See application file for complete search history.

(56) References Cited

U.S. PATENT DOCUMENTS

| 6,020,691 A | 2/2000 | Sun et al. |
| 6,177,768 B1* | 1/2001 | Kamata et al. ............ 315/241 R |
| 6,580,229 B2* | 6/2003 | Murakami et al. .......... 315/224 |

(Continued)

FOREIGN PATENT DOCUMENTS

| JP | 7-222436 | 8/1995 |
| JP | 8-80055 | 3/1996 |
| JP | 11-231008 | 8/1999 |

(Continued)

OTHER PUBLICATIONS

English language Abstract of JP 2004-208357.
English language Abstract of JP 8-80055.
English language Abstract of JP 11-231008.

(Continued)

*Primary Examiner*—Haissa Philogene
(74) *Attorney, Agent, or Firm*—Greenblum & Bernstein, P.L.C.

(57) ABSTRACT

A level shift IC (3*b*) of a power supply/shutoff section (3) is operable, when a shutoff signal (Sa) is input from a timer circuit (8) for a time T during an ON state of a discharge lamp (7), to turn off a MOSFET (3*a*) so as to shut off power supply to a smoothing capacitor (4). When a detection signal (Sb) of a capacitor voltage is lowered to a value less than a reference voltage Vr1 during input of the shutoff signal (Sa), an output of a comparator (10) is changed from an H level to an L level in an inverted manner. In conjunction with this change, respective outputs of an auxiliary control circuit (12) and a NOT element (12*a*, 12*b*) are changed from an L level to an H level in an inverted manner. As a result, a current flows from the NOT element (12*a*) to an LED (13*b*) through a resistor (13*a*) to turn on the LED (13*b*). Thus, a life end of the smoothing capacitor 4 is annunciated, and a main control circuit (6) is operable to suppress an output of an inverter main circuit (5).

13 Claims, 7 Drawing Sheets

U.S. PATENT DOCUMENTS

| | | |
|---|---|---|
| 6,864,645 B2 | 3/2005 | Sun et al. |
| 6,914,395 B2 * | 7/2005 | Yamauchi et al. ........... 315/308 |
| 7,432,616 B2 | 10/2008 | Hatai et al. |
| 2006/0164842 A1 | 7/2006 | Goriki et al. |
| 2007/0103100 A1 | 5/2007 | Yufuku et al. |
| 2007/0296355 A1 * | 12/2007 | Hamamoto et al. ......... 315/309 |

FOREIGN PATENT DOCUMENTS

| | | |
|---|---|---|
| JP | 3324239 | 7/2002 |
| JP | 2002-281735 | 9/2002 |
| JP | 2004-208357 | 7/2004 |
| WO | 2004/084395 | 9/2004 |

OTHER PUBLICATIONS

English language Abstract of JP 2002-281735.
English language Abstract of JP 3324239.
English language Abstract of JP 7-222436.

* cited by examiner

PRIOR ART

FIG. 7

DISCHARGE LAMP LIGHTING DEVICE, AND LIGHTING EQUIPMENT AND LIGHTING SYSTEM USING THE DEVICE

TECHNICAL FIELD

The present invention relates to a discharge lamp lighting device for lighting a discharge lamp (hereinafter referred to shortly as "lighting device"), and an illumination apparatus and an illumination system using the lighting device.

BACKGROUND ART

Figure 7:
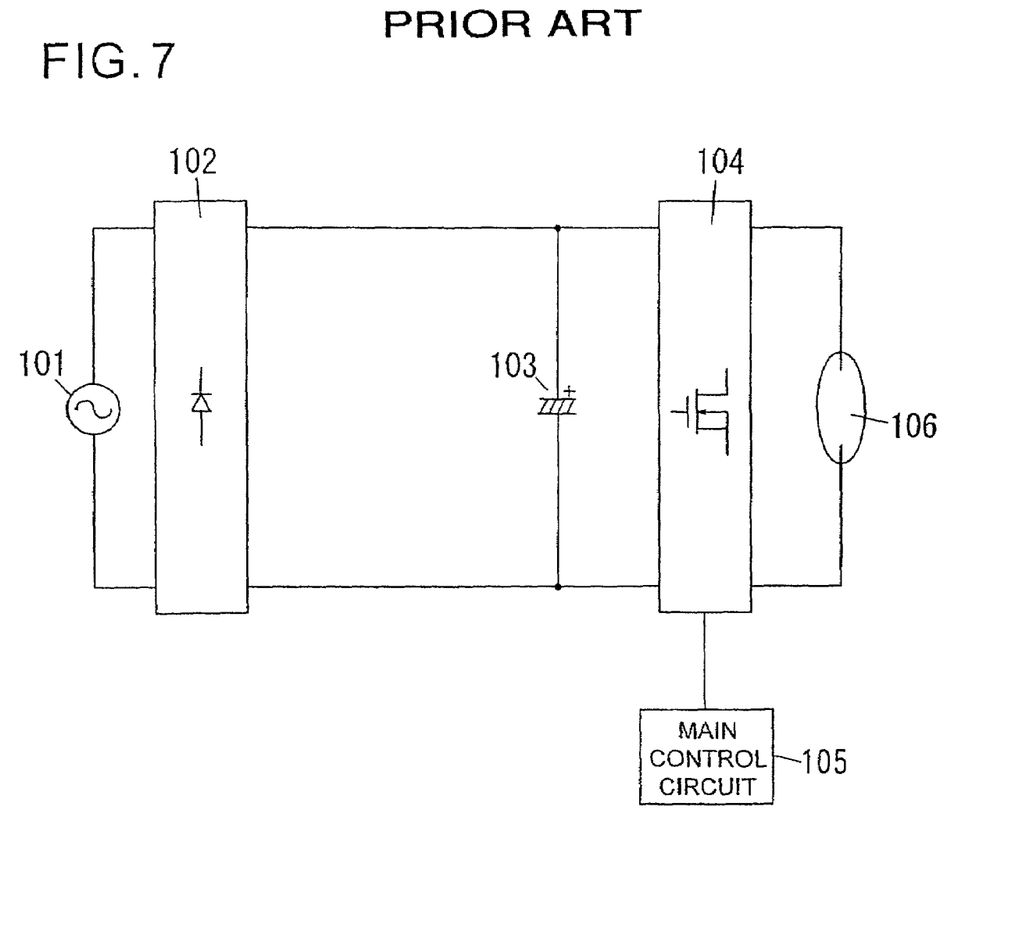
FIG. 7 is a circuit diagram showing the configuration of a conventional lighting device

FIG. 7 shows a circuit configuration of a conventional lighting device. As shown in FIG. 7, in this conventional lighting device, an AC power of a commercial power source 101 is rectified to a DC power by a rectifier 102. After this DC power is smoothed by a smoothing capacitor 103 and then converted to an AC power by an inverter main circuit 104, the AC power is supplied to a discharge lamp 106. A main control circuit 105 is operable to control an operation of the inverter main circuit 104 so that the AC power to be supplied to the discharge lamp 106 is controlled in a desired manner.

The smoothing capacitor 103 requires having a large capacitance. Thus, an aluminum foil electrolytic capacitor is typically used as the smoothing capacitor 103. In the aluminum foil electrolytic capacitor, an electrochemical reaction is produced thereinside, and thereby the capacitance will be reduced along with an increase in operating time. This causes a problem about deterioration in the original smoothing function and increase in loss, and its lifetime is limited to a certain period (e.g., guaranteed life: 12000 hours at 105° C.). As above, the lifetime of the aluminum foil electrolytic capacitor is shorter than other electronic components, and thereby a lifetime of the lighting device is determined by the aluminum foil electrolytic capacitor.

Therefore, for example, in an inverter device for a motor as a load, there has been known one type designed such that a voltage across both ends (i.e., both-end voltage) of an aluminum foil electrolytic capacitor (smoothing capacitor) is measured after an elapse of a given time from a time when the both-end voltage is lowered to a given value during shutoff of power input to an inverter main circuit or occurrence of a power interruption, and a life end of the smoothing capacitor is determined depending on whether the measured both-end voltage is equal to or less than a threshold value. Further, this inverter device is operable, when the measured both-end voltage is equal to or less than the threshold value, to annunciate the life end of the smoothing capacitor (see, for example, the following Patent Publication 1).

There has been proposed another inverter device designed to measure a discharge time of a smoothing capacitor during shutoff of power input to an inverter main circuit, and annunciate a life end of the smoothing capacitor when the discharge time becomes equal to or less than a predetermined threshold value (see, for example, the following Patent Publication 2).

There has been proposed yet another inverter device designed to detect a ripple voltage or ripple current of a smoothing capacitor, and perform a determination on a life end of the smoothing capacitor based on a result of a comparison between the detected ripple voltage or current and a predetermined value (see, for example, the following Patent Publication 3).

Patent Publication 1: JP 8-80055 A
Patent Publication 2: Japanese Patent No. 3324239
Patent Publication 3: JP 7-222436 A

DISCLOSURE OF THE INVENTION

Problems to Be Solved by Invention

As mentioned above, in the inverter devices for a motor as a load, as disclosed in the Patent Publications 1 to 3, the determination on the life end of the smoothing capacitor is performed only during power-off, such as during shutoff of power input to the inverter main circuit according to a power-source switching operation or during occurrence of a power interruption. Thus, these techniques cannot be used for a determination on a life end of a smoothing capacitor in an inverter device designed to be constantly driven.

The inverter device disclosed in the Patent Publication 2 is required to reflect the result of the determination on the life end of the smoothing capacitor performed during power-off, when the power is subsequently turned on. For this purpose, the inverter device is essentially equipped with a nonvolatile memory. This is undesirable from a practical standpoint.

The inverter device disclosed in the Patent Publication 3 is required to detect a relatively small ripple component superimposed on a smoothed output (e.g., several V of ripple voltage superimposed on several hundred V of smoothed voltage). Thus, it is difficulty to adequately measure the ripple component, resulting in a large measurement error.

The present invention has been made to solve the above conventional problems, and an object thereof is to provide a lighting device capable of performing a determination on a life end of a smoothing capacitor accurately in a simplified configuration even when a discharge lamp is constantly turned on, and an illumination apparatus and an illumination system using the lighting device.

Means for Solving Problems

A lighting device (discharge lamp lighting device) of the present invention made for the purpose of achieving the above object comprises a DC power source circuit, a smoothing capacitor, an inverter main circuit, a main control circuit, a timer circuit, a power supply suppression section, a voltage/voltage drop detection section, a first comparator and an auxiliary control circuit. In the above lighting device, the smoothing capacitor is connected to an output end of the DC power source circuit. The inverter main circuit is adapted to convert a DC power output from the smoothing capacitor, to an AC power, and supply the AC power to a discharge lamp. The main control circuit is adapted to control the inverter main circuit so as to control the AC power to be supplied to the discharge lamp. The timer circuit is adapted to count a predetermined time. The power supply suppression section is adapted to suppress power supply to the smoothing capacitor during a period where the timer circuit counts the predetermined time. The voltage/voltage drop detection section is adapted to detect a voltage or a voltage drop of the smoothing capacitor at least during a period where the power supply to the smoothing capacitor is suppressed. The first comparator is adapted to compare between a detection value of the voltage or the voltage drop of the smoothing capacitor and a first threshold value, and output a result of the comparison. The auxiliary control circuit is adapted to perform a control operation depending on the output of the first comparator.

The lighting device of the present invention can voluntarily create a momentary power interruption condition for a predetermined time by utilizing a moderate discharge characteristic of a discharge lamp. Thus, even when the discharge lamp is constantly turned on, a determination on a life end of the smoothing capacitor can be performed accurately in a simplified configuration without using a power-source switching operation as in the conventional technique.

Preferably, the lighting device of the present invention includes an annunciator adapted to be controlled depending on the output of the first comparator by the auxiliary control circuit, in such a manner as to annunciate a life end of the smoothing capacitor to the outside. This allows a user to quickly figure out the life end of the smoothing capacitor.

Preferably, in the lighting device of the present invention, the auxiliary control circuit is operable to control an operation of the main control circuit depending on the output of the first comparator. This makes it possible to ensure a safety when the smoothing capacitor has come to its life end.

The lighting device of the present invention may further include a discharge-lamp-voltage detection section adapted to detect a discharge lamp voltage. In this case, the timer circuit is preferably designed such that the predetermined time to be counted is changed in response to a change in a detection value of the discharge lamp voltage, and, specifically, the predetermined time to be counted becomes shorter as the detection value of the discharge lamp voltage becomes higher. This makes it possible to perform the determination on the life end of the smoothing capacitor without occurrence of fading-out, irrespective of a life of the discharge lamp.

The lighting device of the present invention may further include a discharge-lamp-voltage detection section adapted to detect a discharge lamp voltage, a discharge-lamp-life determination section adapted to determine a life end of the discharge lamp based on a detection value of the discharge lamp voltage, a first additional annunciator adapted to annunciate the life end of the discharge lamp to the outside, and a second additional annunciator adapted to annunciate the life ends of both the smooth capacitor and the discharge lamp to the outside. In this case, the auxiliary control circuit is preferably operable to control each of the three annunciators based on the output of the first comparator and an output of the discharge-lamp-life determination section. This makes it possible to distinguish among the life end of the smoothing capacitor, the life end of the discharge lamp, and the life ends of both the smoothing capacitor and the discharge lamp. Thus, a user can take an adequate action depending on the situation.

In the lighting device of the present invention, the DC power source circuit may include a step-up chopper circuit. In this case, the power supply suppression section is preferably operable to control a step-up operation of the step-up chopper circuit so as to suppress an output thereof to suppress the power supply to the smoothing capacitor. This allows the power supply suppression section to additionally serve as the step-up chopper circuit so as to facilitate simplification in configuration.

The lighting device of the present invention may include a discharge-lamp-voltage detection section adapted to detect a discharge lamp voltage. In this case, the discharge lamp lighting device is preferably designed such that a threshold value for use in the first comparator can be changed depending on a detection value of the discharge lamp voltage. This makes it possible to accurately perform the determination on the life end of the smoothing capacitor irrespective of a life of the discharge lamp.

Preferably, the lighting device of the present invention is designed such that, when the first comparator compares between the detection value of the voltage of the smoothing capacitor and the first threshold value, the first threshold value becomes larger as a detection value of a discharge lamp voltage becomes higher, and, when the first comparator compares between the detection value of the voltage drop of the smoothing capacitor and the first threshold value, the first threshold value becomes smaller as the detection value of the discharge lamp voltage becomes higher. This makes it possible to accurately perform the determination on the life end of the smoothing capacitor based on the detection value of the voltage or the voltage drop thereof, irrespective of a life of the discharge lamp.

Preferably, in the lighting device of the present invention, the timer circuit is designed to start counting the predetermined time in response to a trigger signal from an external control system, and the auxiliary control circuit is operable to output a result of a determination on a life end of the smoothing capacitor to the external control system, depending on the output of the first comparator. This allows the external control system to recognize, evaluate and issue an instruction about a determination result as an illumination system, based on the determination result of the life end from the lighting device.

The lighting device of the present invention may further include a second comparator adapted to compare between the detection value of the voltage or the voltage drop of the smoothing capacitor and a second threshold value, so as to output a result of the comparison, and a third comparator adapted to compare between the detection value of the voltage or the voltage drop of the smoothing capacitor and a third threshold value, so as to output a result of the comparison. Preferably, the first to third comparators can provide an output in a three-stage manner according to a decrease in the voltage of the smoothing capacitor or an increase in the voltage drop of the smoothing capacitor. In this case, the auxiliary control circuit is preferably operable, in the first stage, to allow the annunciator to annunciate the life end of the smoothing capacitor to the outside. Further, the auxiliary control circuit is preferably operable, in the second stage, to control an operation of the main control circuit so as to controllably blink the discharge lamp, and, in the third stage, to control the operation of the main control circuit so as to turn off the discharge lamp. This allows an indication of the indicator means to be changed to the external indication, the blinking of the discharge lamp and the turn-off of the discharge lamp in this order, according to a level of seriousness in the life end of the smoothing capacitor. Thus, a user can take an adequate action depending on the output of the auxiliary control circuit.

An illumination apparatus of the present invention is equipped with any one of the above lighting devices of the present invention. An illumination system of the present invention is equipped with any one of the above lighting devices of the present invention. The illumination apparatus or the illumination system of the present invention has the same functions and effects as those of the lighting device.

Advantages of Invention

The lighting device, the illumination apparatus and the illumination system of the present invention can perform a determination on a life end of a smoothing capacitor accurately in a simplified configuration even when a discharge lamp is constantly turned on.

EXPLANATION OF CODES

1: Commercial power source
2: rectifier
3: power supply/shutoff section
4: smoothing capacitor
5: inverter main circuit
6: main control circuit
7: discharge lamp
8: timer circuit
9: capacitor-voltage detection circuit
10: comparator
11: reference voltage source
12: auxiliary control circuit
13: indicator circuit

BEST MODE FOR CARRYING OUT THE INVENTION

This application is based upon Japanese Patent Application No. 2004-311499, filed in Japan, the entire contents of which are hereby incorporated by reference. With reference to the accompanying drawings, an embodiment of the present invention will now be specifically described. A common element or component in the accompanying drawings will be defined by the same reference numeral or code.

First Embodiment

Figure 1:
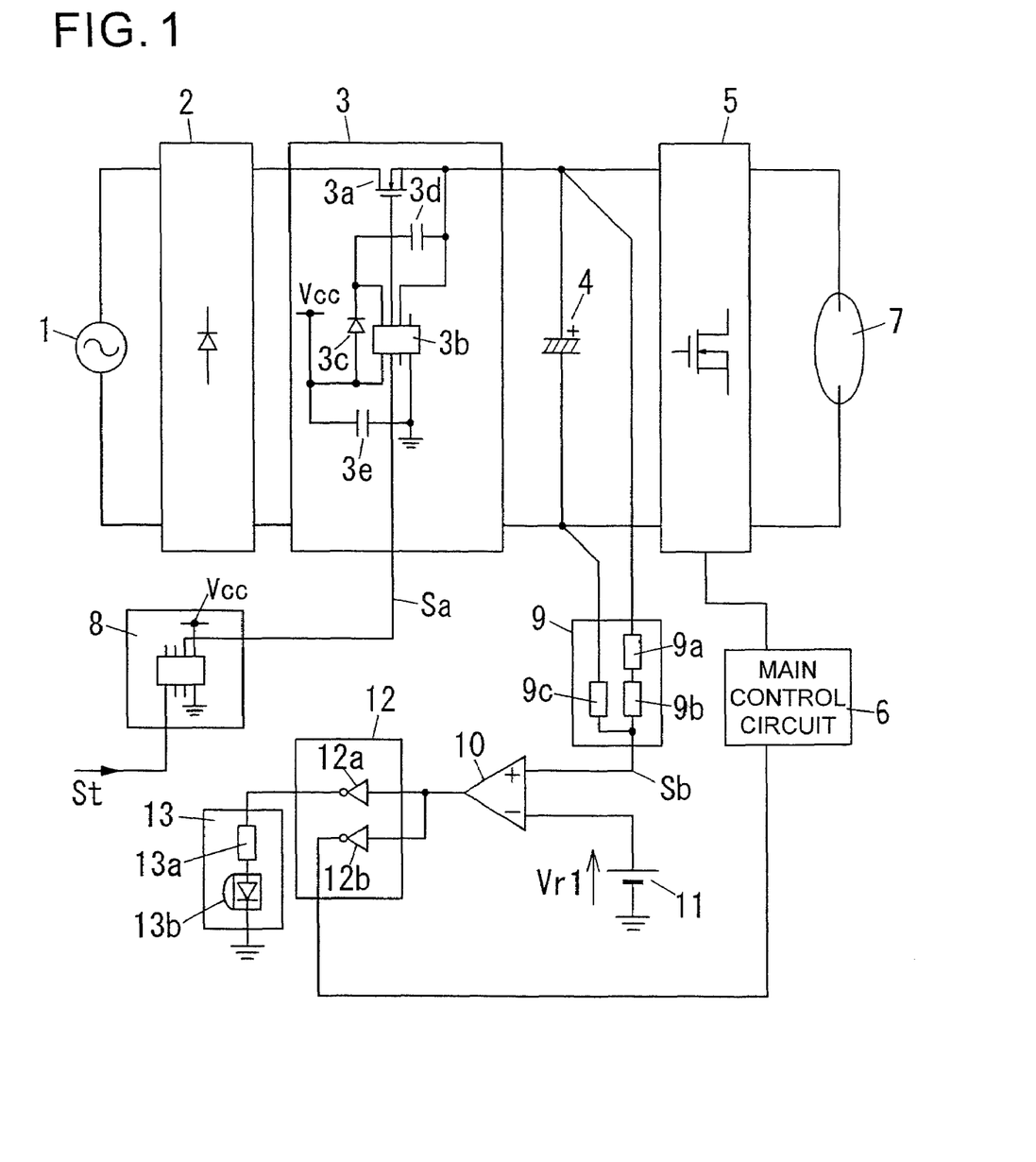
FIG. 1 is a circuit diagram showing the configuration of a lighting device according to a first embodiment of the present invention.

FIG. 1 shows a circuit configuration of a lighting device according to a first embodiment of the present invention. As shown in FIG. 1, this lighting device comprises a commercial power source 1, a rectifier 2, a power supply/shutoff section 3, a smoothing capacitor 4, an inverter main circuit 5, a main control circuit 6, a discharge lamp 7, a timer circuit 8, a capacitor-voltage detection circuit 9, a comparator 10, a reference voltage source 11, an auxiliary control circuit 12, and an indicator circuit 13.

An AC power supplied from the commercial power source 1 is rectified to a DC power by the rectifier 2. The DC power is input to the smoothing capacitor 4 through the power supply/shutoff section 3, and smoothed by the smoothing capacitor 4. The smoothed DC power is converted to an AC power by the inverter main circuit 5, and the AC power is supplied to the discharge lamp 7. In this process, the main control circuit 6 is operable to control an operation of the inverter main circuit 5 so that the AC power to be supplied to the discharge lamp 7 is controlled in a desired manner (at a desired value). In the above configuration, a DC power source circuit is made up of the commercial power source 1 and the rectifier 2.

The power supply/shutoff section 3 includes a MOSFET 3a connected in series to a positive voltage-side output terminal of the rectifier 2, a level shift IC 3b (e.g., IR2101 produced by International Rectifier Corp.) adapted to drive the MOSFET 3a in an on-off manner, a diode 3c for operating the level shift IC 3b, and two capacitors 3d, 3e. A series circuit consisting of the diode 3c and the capacitor 3d is connected between a control power source Vcc and a source of the MOSFET 3a. The capacitor 3e is connected to between the control power source Vcc and the ground. Each of the diode 3c and the two capacitors 3d, 3e is also connected to the level shift IC 3b. An aluminum foil electrolytic capacitor is used as the smoothing capacitor 4.

The timer circuit 8 is composed, for example, of a 4-bit microcomputer (e.g., PIC12F675 produced by Microchip Technology Inc.). The timer circuit 8 can divide a fundamental oscillation frequency to produce a divided time an integer multiple of which is the fundamental oscillation frequency. For example, given that the fundamental oscillation frequency is 4 MHz, one cycle thereof can be divided by 1 to 4,000,000 to produce a divided time of 25 μsec to 1 sec. The timer circuit 8 is operable, in response to receiving a trigger signal St from outside, to start counting, and output a shutoff signal Sa to the level shift IC 3b of the power supply/shutoff section 3 during a period from the start of the counting through until a given count number is counted up. That is, the timer circuit 8 is adapted to output the shutoff signal Sa for a given counting time T.

The capacitor-voltage detection circuit 9 serves as a means to detect a both-end voltage of the smoothing capacitor 4, and comprises a series circuit consisting of resistors 9a, 9b, 9c connected between both ends of the smoothing capacitor 4. A voltage at a connection point between respective negative voltage sides of the resistors 9b, 9c is output as a detection signal Sb.

The detection signal Sb of the capacitor voltage is input to a noninverting input terminal of the comparator 10 (e.g., LM211). Further, a reference voltage Vr1 of the reference voltage source 11 is input to an inverting input terminal of the comparator 10.

The auxiliary control circuit 12 comprises a logic IC having two NOT elements 12a, 12b. Each of input terminals of the NOT elements 12a, 12b is connected to an output terminal of the comparator 10. An output terminal of the NOT element 12a is connected to the indicator circuit 13, and an output terminal of the NOT element 12b is connected to the main control circuit 6. The indicator circuit 13 comprises a series circuit consisting of a resistor 13a and an LED 13b, which is connected between the output terminal of the NOT element 12a and the ground.

An operation of determining a life end of the smoothing capacitor 4 will be described below. In the first embodiment, the determination on the life end is performed by utilizing a characteristic of the smoothing capacitor 4 that a capacitance is reduced along with an increase in operating time. The timer circuit 8 starts counting in response to the trigger signal St input from an external control device during an ON state of the discharge lamp 7, and outputs the shutoff signal Sa for the counting time T before count-up. During an input of the shutoff signal Sa from the timer circuit 8, the level shift IC 3b of the power supply/shutoff section 3 operates to turn off the MOSFET 3a so as to shut off power supply to the smoothing capacitor 4.

Therefore, a both-end voltage of the smoothing capacitor 4 starts dropping, and will gradually fall off. If the capacitance of the smoothing capacitor 4 is reduced due to a long operating time of the smoothing capacitor 4, a voltage drop per time becomes larger. When the detection signal Sb of the capacitor voltage becomes less than the reference voltage Vr1 during the input of the shutoff signal Sa, an output of the comparator 10 is changed from an H level to an L level in an inverted manner. Thus, the respective outputs of the NOT elements 12a, 12b of the auxiliary control circuit 12 are changed from an L level to an H level in an inverted manner. As a result, a current flows from the NOT element 12a to the LED 13b through the resistor 13a to turn on the LED 13b so as to annunciate the life end of the smoothing capacitor 4.

When the count-up operation of the timer circuit 8 is completed after an elapse of the counting time T, the output of the shutoff signal Sa is stopped. Thus, the level shift IC 3b operates to turn on the MOSFET 3a so as to re-supply power to the smoothing capacitor 4. However, the main control circuit 6 receives the H level output from the NOT element 12b in response to the determination made within the counting time T that the smoothing capacitor 4 has come to its life end, and therefore controls an operation of the inverter main circuit 5 in such a manner as to suppress a power to be supplied to the discharge lamp 7. Specifically, the main control circuit 6 operates to stop an output of the inverter main circuit 5 so as to turn off the discharge lamp 7. Alternatively, the main control circuit 6 operates to intermittently enable the output of the inverter main circuit 5 so as to blink the discharge lamp 7. Alternatively, the main control circuit 6 operates to reduce the output of the inverter main circuit 5 so as to lower a dimming level of the discharge lamp 7 to 50%.

As above, in the first embodiment, the power supply to the smoothing capacitor 4 is voluntarily shut off during the ON state of the discharge lamp 7. Thus, a state in the period of the counting time T for turning off the MOSFET 3a is the same as a momentary power interruption. However, in the first embodiment, a load of the inverter main circuit 5 is the discharge lamp 7. Thus, given that the counting time T of the timer circuit 8 is a maximum of 30 msec, a momentary power interruption for 30 msec or less has no influence on a lighted state of the discharge lamp 7 because of a moderate response characteristic thereof.

In a load other than a discharge lamp (e.g., motor load), if a momentary power interruption is intentionally generated during operation, some adverse effect will occur. In contrast, such an adverse effect never occurs when the load is a discharge lamp as in the first embodiment. Thus, in a period of a momentary power interruption generated intentionally or voluntarily during operation, the both-end voltage of the smoothing capacitor 4 can be compared with the threshold value to determine the life end of the discharge lamp 4. This makes it possible to accurately perform the determination on the life end of the smoothing capacitor 7 even when the discharge lamp 7 is constantly turned on. In addition, differently from the conventional inverter device disclosed, for example, in the Patent Publication 2, there is no need for a nonvolatile memory, and therefore the configuration of the lighting device can be simplified.

The trigger signal St may be generated inside the lighting device. In this case, a signal to be periodically generated, for example, about once a day, or a signal to be generated when a lighting operation becomes stable after several minutes from power-on, may be used.

In the first embodiment, the both-end voltage of the capacitor-voltage detection circuit 9 is detected, and the life end of the smoothing capacitor 4 is annunciated when the detection signal Sb of the capacitor voltage is lowered to a value less than the reference voltage Vr1 within the counting time T. Alternatively, means for detecting a drop in the capacitor voltage within the counting time T from the detection signal Sb of the capacitor voltage and outputting a voltage-drop detection signal may be provided. In this case, the life end of the smoothing capacitor 4 is annunciated when the voltage-drop detection signal becomes greater than a reference voltage within the counting time T.

Second Embodiment

Figure 2:
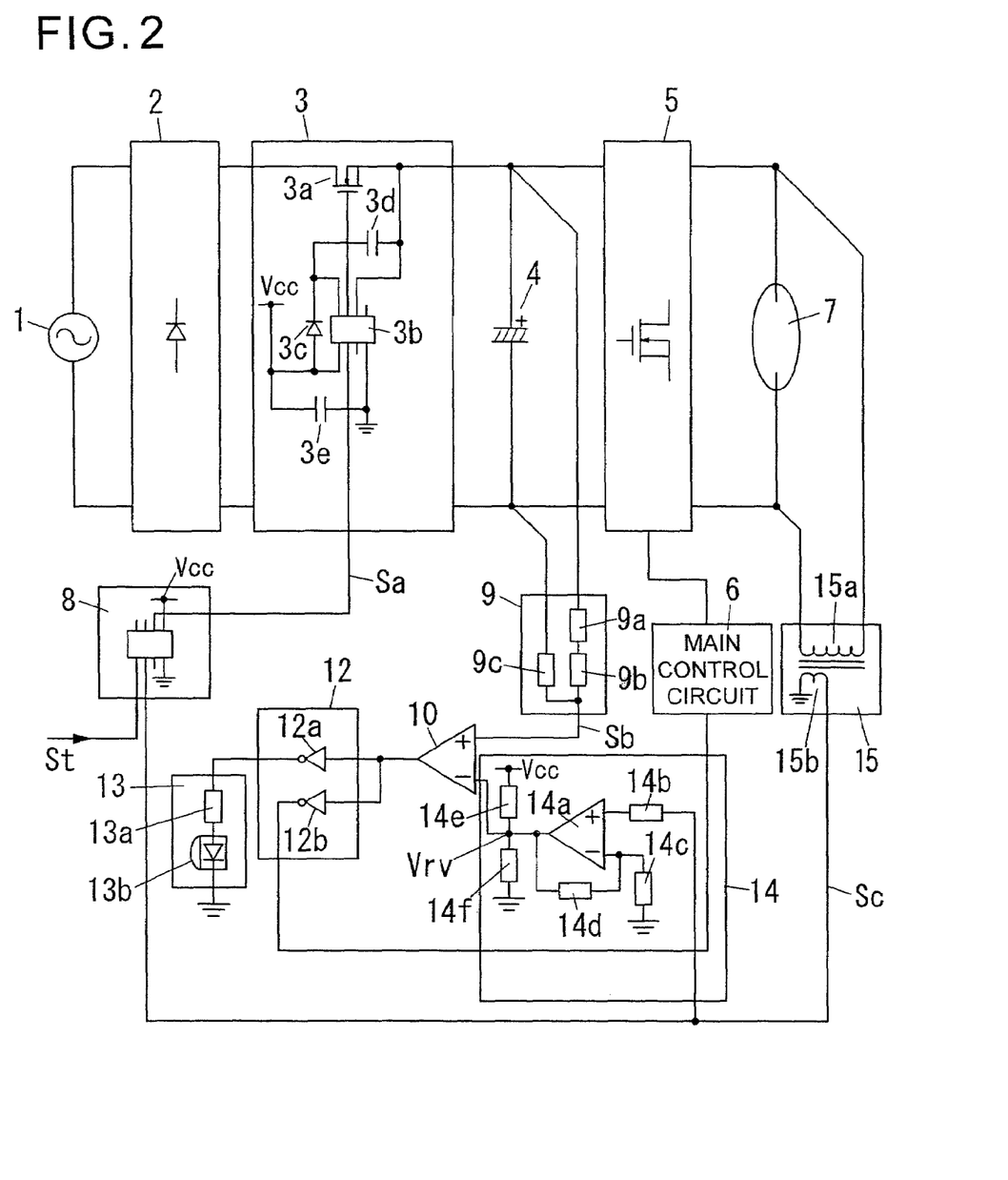
FIG. 2 is a circuit diagram showing the configuration of a lighting device according to a second embodiment of the present invention.

With reference to FIG. 2, a second embodiment of the present invention will be described below. FIG. 2 shows a circuit configuration of a lighting device according to the second embodiment. The lighting device according to the second embodiment is different from the lighting device according to the first embodiment only in the following points. A first difference is that a reference voltage generation circuit 14 is provided in place of the reference voltage source 11. A second difference is that a transformer having a primary winding 15a connected in parallel to a discharge lamp 7 and a secondary winding 15b magnetically coupled to the primary winding 15a is provided. The remaining configuration is the same as that of the lighting device according to the first embodiment. Thus, for avoiding duplication of description, the same element or component as that in the first embodiment is defined by the same reference numeral or code, and its description will be omitted.

The reference voltage generation circuit 14 comprises an operational amplifier 14a and five resistors 14b, 14c, 14d, 14e, 14f. One end of the resistor 14b is connected to a non-inverting input terminal of the operational amplifier 14a. The resistor 14c is connected between an inverting input terminal of the operational amplifier 14a and the ground. The resistor 14d is connected between the inverting input terminal and an output terminal of the operational amplifier 14a. The two resistors 14e, 14f are connected in series between a control power source Vcc and the ground, and the output terminal of the operational amplifier 14a is connected to a connection point between the resistors 14e, 14f. A voltage at the connection point between the resistors 14e, 14f is output as a reference voltage Vrv.

The secondary winding 15b of the transformer 15 has one end connected to the ground, and the other end connected to the other end of the resistor 14b and a timer circuit 8. The transformer 15 (secondary winding 15b) is operable to detect a both-end voltage of the discharge lamp 7 (discharge lamp voltage), and output a detection signal Sc to the reference voltage generation circuit 14 and the timer circuit 8.

Generally, the discharge lamp 7 is susceptible to a momentary power interruption in a final stage of its life despite a moderate response characteristic thereof, and likely to have a fade-out state. Further, it is known that the discharge lamp voltage is gradually increased in the course of a lifetime of the discharge lamp 7. From this point of view, the lighting device according to the second embodiment is designed such that the detection signal Sc of the discharge lamp voltage detected by the transformer 15 is input to the timer circuit 8, and the timer circuit 8 is designed such that a counting time T becomes shorter as the detection signal Sc of the discharge lamp voltage becomes higher. Specifically, the detection signal Sc of the discharge lamp voltage is input to the timer circuit 8 through an A/D converter installed in a microcomputer constituting the timer circuit 8. Further, the counting time is changed by setting a dividing ratio at a low value when the detection signal Sc of the discharge lamp voltage is high, and setting the dividing ratio at a high value when the detection signal Sc of the discharge lamp voltage is low.

Thus, the counting time T for turning off a MOSFET 3a to create a momentary power interruption condition is gradually reduced as the discharge lamp comes close to its life end, to allow the life end of the smoothing capacitor 4 to be determined without fading-out irrespective of the life of the discharge lamp 7.

As mentioned above, the discharge lamp voltage is gradually increased in the course of the lifetime of the discharge lamp 7. Further, in order to prevent a luminous flux from changing in the course of the lifetime of the discharge lamp 7, a main control circuit 6 is operable to control an inverter main circuit 5 in such a manner as to input a constant power to the discharge lamp 7. Thus, in the course of the lifetime of the discharge lamp 7, a discharge lamp current is gradually reduced while the discharge lamp voltage is gradually increased. This results in moderating a discharge of the smoothing capacitor 4 to increase a discharge time. From this point of view, the detection signal Sc of the discharge lamp voltage is amplified by a noninverting amplifier composed of the operational amplifier 14a and the three resistors 14b, 14c, 14d, and a current bias is applied to the resistor 14f by an output of the operational amplifier 14a, so as to change the reference voltage Vrv.

Thus, the reference voltage Vrv becomes higher as the detection signal Sc of the discharge lamp voltage becomes higher, so that the life end of the smoothing capacitor 5 can be accurately determined irrespective of the life of the discharge lamp.

Means for detecting a drop in the capacitor voltage within the counting time T from the detection signal Sb of the capacitor voltage and outputting a voltage-drop detection signal may be provided, and the life end of the smoothing capacitor 4 may be annunciated when the voltage-drop detection signal becomes greater than a reference voltage within the counting time T. In this case, the reference voltage may be reduced along with an increase in the detection signal Sb of the capacitor voltage, to accurately perform the determination on the life end of the smoothing capacitor 4 irrespective of the life of the discharge lamp.

Third Embodiment

Figure 3:
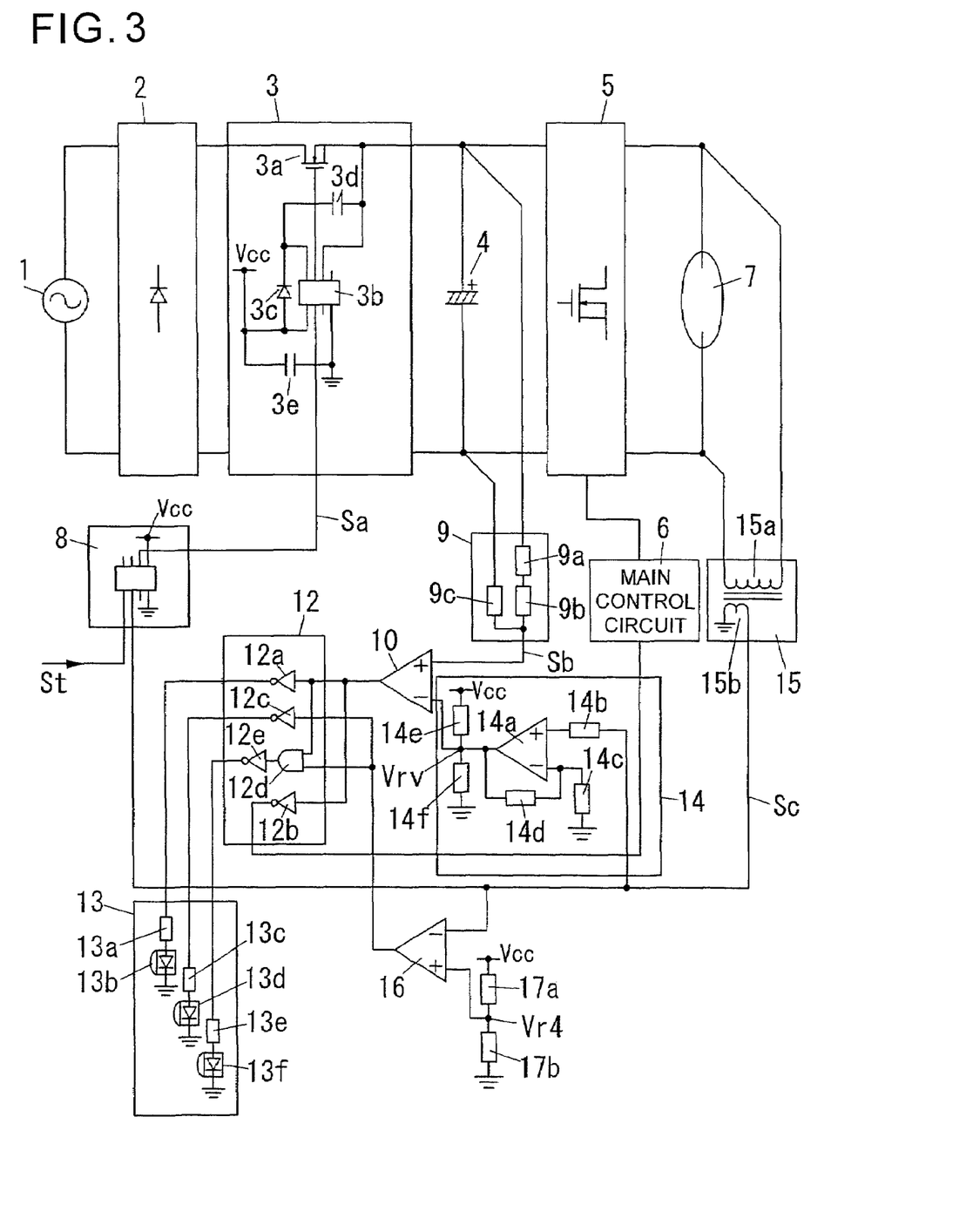
FIG. 3 is a circuit diagram showing the configuration of a lighting device according to a third embodiment of the present invention.

With reference to FIG. 3, a third embodiment of the present invention will be described below. FIG. 3 shows a circuit configuration of a lighting device according to the third embodiment. The lighting device according to the third embodiment is different from the lighting device according to the second embodiment only in the following points. A first difference is that a comparator 16 for determining a life end of a discharge lamp 7, and resistors 17a, 17b for dividing a control power source Vcc to generate a reference voltage Vr4, are provided. A second difference is that an auxiliary control circuit 12 and an indicator circuit 13 are different in configuration from those in the second embodiment. The remaining configuration is the same as that of the lighting device according to the second embodiment. Thus, for avoiding duplication of description, the same element or component as that in the second embodiment is defined by the same reference numeral or code, and its description will be omitted.

An inverting input terminal of the comparator 16 is connected to an output terminal of a secondary winding 15b of a transformer 15. A noninverting input terminal of the comparator 16 is connected to a connection point between the resistors 17a, 17b connected in series between the control power source Vcc and the ground. That is, the comparator 16 is operable to compare between a detection signal Sc of a discharge lamp voltage and the reference voltage Vr4 so as to determine the life end of the discharge lamp 7. More specifically, when the detection signal Sc of the discharge lamp voltage is less than the reference voltage Vr4, it is determined that the discharge lamp 7 has not come to the life end, and an output of the comparator 16 has an H level. When the detection signal Sc of the discharge lamp voltage is greater than the reference voltage Vr4, it is determined that the discharge lamp 7 has come to the life end, and an output of the comparator 16 has an L level.

The auxiliary control circuit 12 comprises a logic IC which has four NOT elements 12a, 12b, 12c, 12e, and an AND element 12d. Respective input terminals of the NOT elements 12a, 12b are connected to an output terminal of a comparator 10. An input terminal of the NOT element 12c is connected to an output terminal of the comparator 16. An input terminal of the AND element 12d is connected to each of the output terminals of the comparators 10, 16. An input terminal of the NOT element 12e is connected to an output terminal of the AND element 12d. Thus, when the smoothing capacitor 4 has come to its life end, respective outputs of the NOT elements 12a, 12b have an H level. When the discharge lamp 7 has come to the life end, an output of the NOT element 12c has an H level. When both the smoothing capacitor 4 and the discharge lamp 7 have come to their life ends, an output of the NOT element has an H level.

The indicator circuit 13 comprises three resistors 13a, 13c, 13e, and three LEDs 13b, 13d, 13f. A series circuit consisting of the resistor 13a and the LED 13b is connected between the output terminal of the NOT element 12a and the ground. A series circuit consisting of the resistor 13c and the LED 13d is connected between the output terminal of the NOT element 12c and the ground. A series circuit consisting of the resistor 13e and the LED 13f is connected between the output terminal of the NOT element 12e and the ground. Thus, when the smoothing capacitor 4 has come to the life end, a current flows from the NOT element 12a to the LED 13b through the resistor 13a to turn on the LED 13b so as to annunciate the life end of the smoothing capacitor 4. When the discharge lamp 7 has come to the life end, a current flows from the NOT element 12c to the LED 13d through the resistor 13c to turn on the LED 13d so as to annunciate the life end of the discharge lamp 7. When both the smoothing capacitor 4 and the discharge lamp 7 have come to their life ends, a current flows from the NOT element 12e to the LED 13f through the resistor 13e to turn on the LED 13f so as to annunciate the life ends of both the smoothing capacitor 4 and the discharge lamp 7.

As above, in the lighting device according to the third embodiment, a user can know not only the life end of the smoothing capacitor 4 but also the life end of the discharge lamp 7. Thus, the user can take an adequate action depending on the situation in an operation of replacing the smoothing capacitor 4 and/or the discharge lamp 7.

Fourth Embodiment

Figure 4:
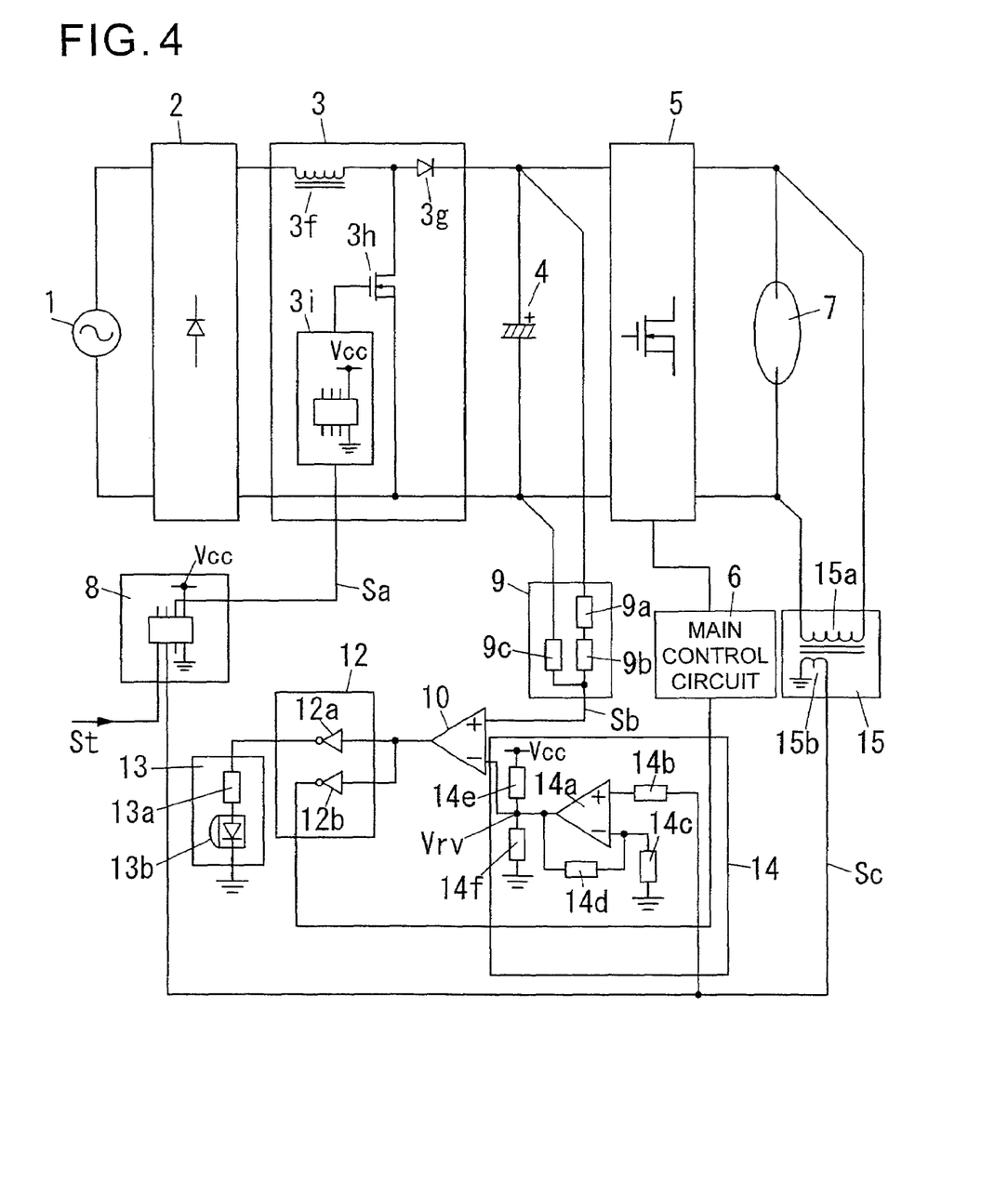
FIG. 4 is a circuit diagram showing the configuration of a lighting device according to a fourth embodiment of the present invention.

With reference to FIG. 4, a fourth embodiment of the present invention will be described below. FIG. 4 shows a circuit configuration of a lighting device according to the fourth embodiment. The lighting device according to the fourth embodiment is different from the lighting device according to the second embodiment only in a configuration of a power supply/shutoff section 3. The remaining configuration is the same as that of the lighting device according to the second embodiment. Thus, for avoiding duplication of description, the same element or component as that in the second embodiment is defined by the same reference numeral or code, and its description will be omitted.

The power supply/shutoff section 3 comprises a choke inductor 3f, a high-speed diode 3g, a MOSFET 3h and a step-up chopper control IC 3i (e.g., MC33262 produced by Motorola, Inc.). A series circuit consisting of the choke inductor 3f and the high-speed diode 3g is connected in series to a positive voltage-side output terminal of a rectifier 2. The MOSFET 3h is connected between output terminals of the rectifier 2 through the inductor 3f. The step-up chopper control IC 3i is adapted to drive the MOSFET 3h. The above components make up a step-up chopper circuit. The step-up chopper control IC 3i is operable to drive the MOSFET 3h and supply a stepped-up output to a smoothing capacitor 4.

The step-up chopper control IC 3i is operable, during a period of a counting time T when a trigger signal St output from the timer circuit 6 is input thereto, to stop an switching operation of the MOSFET 3h and turn off the MOSFET 3h. Thus, a step-up function of the step-up chopper circuit is deactivated, and an output voltage to the smoothing capacitor is lowered to create a momentary power interruption condition as with the first to third embodiments.

Generally, a step-up chopper circuit is provided for the purpose of improving a power factor. The switching element (MOSFET 3h) of the step-up chopper circuit can additionally serve as a switching element of power supply/shutoff means to facilitate simplification in configuration without increasing the number of switching elements. Further, in the fourth embodiment, a determination on a life end of the smoothing capacitor 4 is performed based on a detection signal Sb of a capacitor voltage and a detection signal Sc of a discharge lamp voltage, in the same manner as that in the second embodiment.

Fifth Embodiment

Figure 5:
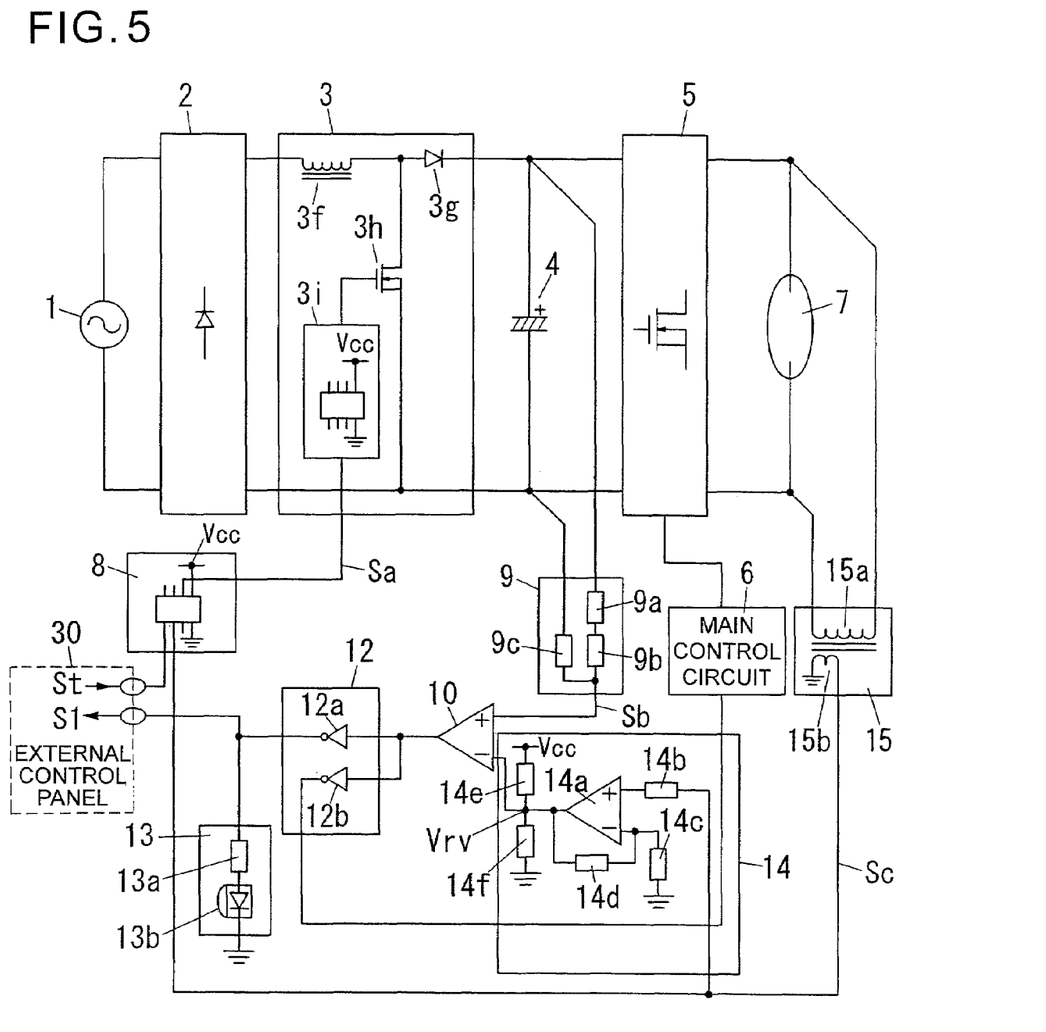
FIG. 5 is a circuit diagram showing the configuration of a lighting device according to a fifth embodiment of the present invention.

With reference to FIG. 5, a fifth embodiment of the present invention will be described below. FIG. 5 shows a circuit configuration of a lighting device according to the fifth embodiment. The lighting device according to the fifth embodiment is different from the lighting device according to the fourth embodiment only in that an external control panel 30 of an external control system is provided. The remaining configuration is the same as that of the lighting device according to the fourth embodiment. Thus, for avoiding duplication of description, the same element or component as that in the fourth embodiment is defined by the same reference numeral or code, and its description will be omitted.

Recent years, a system of operating various devices at home, such as illumination, sensors, air-conditioner and electronic locks, from a portable phone or a PC using the Internet in a remote control manner has been utilized. In this system, each of the devices is connected to an information controller placed inside home, and collectively managed by a PC or a portable phone via a gateway.

The external control panel 30 is the information controller or the like, and adapted to collectively control an illumination system. Various illumination apparatuses each equipped with the lighting device can be connected to the external control panel 30 to form an illumination system, and controlled by the external control panel 30. A user may voluntarily output a trigger signal St from the external control panel 30 to each of the lighting devices at a desired timing to perform a determination on a life end of a smoothing capacitor 4. That is, in each of the lighting devices, the determination on the life end of the smoothing capacitor 4 can be positively performed.

An auxiliary control circuit 12 is operable to output a result of the determination on the life end of the smoothing capacitor 4 to be output to an indicator circuit 13, to the external control panel 30 as a life-end determination signal S1 of the smoothing capacitor 4. Then, the external control panel 30 is operable, based on life-end determination signals S1 from a plurality of lighting devices, to recognize, evaluate and issue an instruction about a determination result as an illumination system.

Sixth Embodiment

Figure 6:
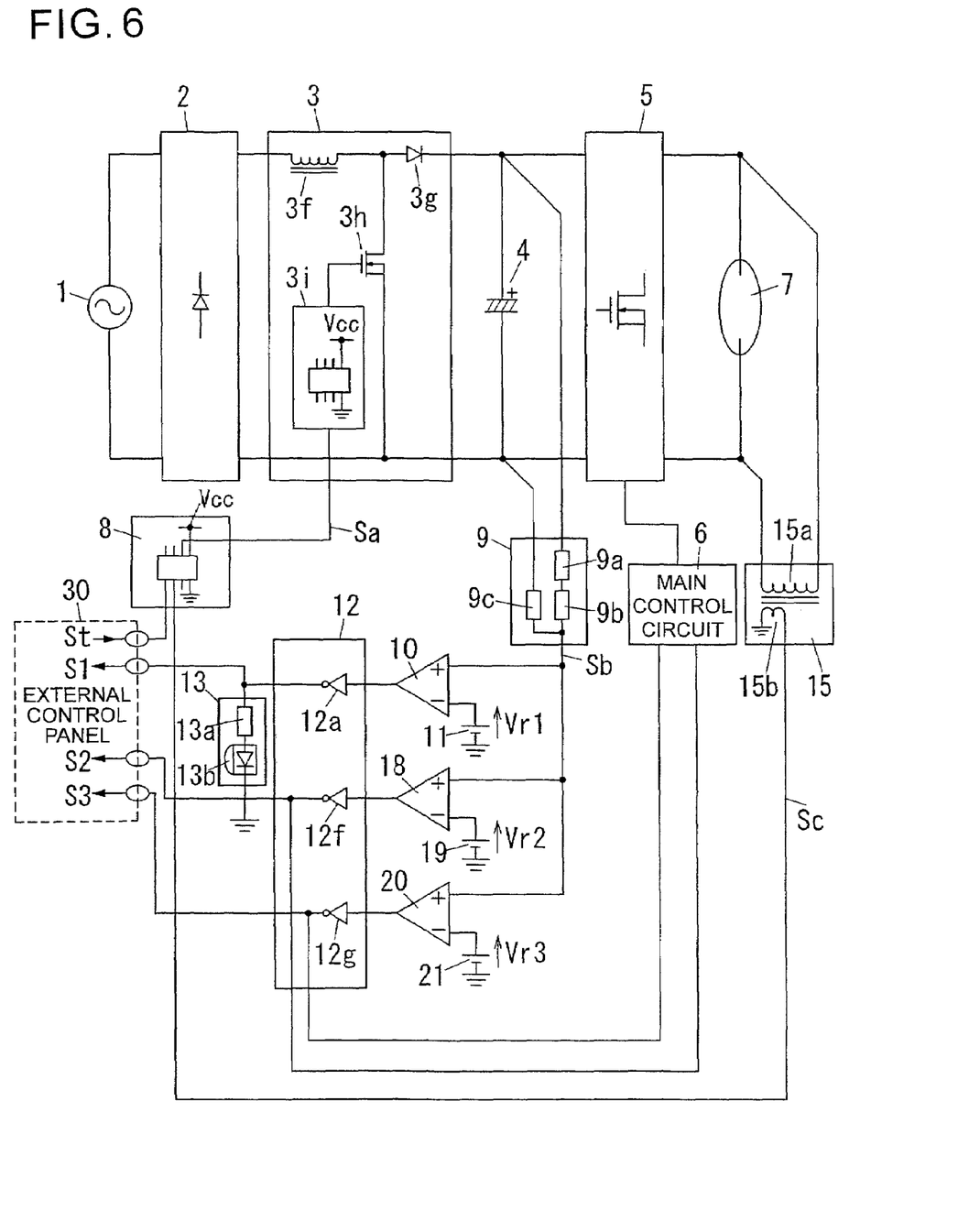
FIG. 6 is a circuit diagram showing the configuration of a lighting device according to a sixth embodiment of the present invention.

With reference to FIG. 6, a sixth embodiment of the present invention will be described below. FIG. 6 shows a circuit configuration of a lighting device according to the sixth embodiment. The lighting device according to the sixth embodiment is different from the lighting device according to the fifth embodiment only in the following points. A first difference is that two comparators 18, 20 and two reference voltage sources 19, 21 are provided. A second difference is that an auxiliary control circuit 12 is different in configuration from that in the fifth embodiment. The remaining configuration is the same as that of the lighting device according to the fifth embodiment. Thus, for avoiding duplication of description, the same element or component as that in the fifth embodiment is defined by the same reference numeral or code, and its description will be omitted.

A detection signal Sb of a capacitor voltage is input to a noninverting input terminal of the comparator 18. An inverting input terminal of the comparator 18 is connected to the reference voltage source 19. The detection signal Sb of the capacitor voltage is input to a noninverting input terminal of the comparator 20. An inverting input terminal of the comparator 20 is connected to the reference voltage source 21. An output of the comparator 18 is input to a NOT element 12f of the auxiliary control circuit 12, and an output of the comparator 20 is input to a NOT element 12g of the auxiliary control circuit 12.

A magnitude relation of respective reference voltages Vr1, Vr2, Vr3 of the reference voltage sources 11, 19, 21 is as follows:

$$Vr1 > Vr2 > Vr3$$

Thus, during a determination on a life end of a smoothing capacitor 4, when the detection signal Sb of the capacitor voltage is gradually lowered after initiation of discharge in the smoothing capacitor, the respective outputs of the comparators are changed from an H level to an L level in an inverted manner in the following order: the comparator 10→the comparator 18→the comparator 20. As a result, respective outputs of the NOT elements are changed from an L level to an H level in an inverted manner in the following order: the NOT element 12a→the NOT element 12f→the NOT element 12g.

Then, the NOT element 12a having an output to be firstly inverted during the determination on the life end of the smoothing capacitor 4 is operable to output a life-end determination signal S1 of the smoothing capacitor 4 to an indicator circuit 13 so as to turn on an LED 13b, and output the life-end determination signal S1 to an external control panel 30. The NOT element 12f having an output to be secondly inverted is operable to output a blink control signal S2 to a main control circuit 6, and output the blink control signal S2 to the external control panel 30. The NOT element 12g having an output to be thirdly inverted is operable to output a stop control signal S3 to the main control circuit 6, and output the stop control signal S3 to the external control panel 30. The main control circuit 6 is operable, in response to the blink control signal S2, to control an inverter main circuit 6 in such a manner as to blink a discharge lamp 7. Further, the main control circuit 6 is operable, in response to the stop control signal S3, to control the inverter main circuit 6 in such a manner as to turn off the discharge lamp 7.

That is, an annunciation mode is changed to an external indication by the indicator circuit 13, blinking of the discharge lamp 7 and turn-off of the discharge lamp 7 in this order depending on a level of seriousness in the life end of the smoothing capacitor 4. Thus, a user can take an adequate action depending on the output of the auxiliary control circuit 12.

The external control panel 30 is operable, based on life-end determination signals S1, the blink control signal S2 and the stop control signal S3 from the lighting device, to recognize, evaluate and issue an instruction about a determination result as an illumination system.

An illumination apparatus equipped with any one of the lighting devices according to the first to sixth embodiments can have the same functions and effects as those in the first to sixth embodiments. Further, an illumination system using the illumination apparatus can have the same functions and effects.

Means for detecting a drop in a capacitor voltage within the counting time T from the detection signal Sb of the capacitor voltage and outputting a voltage-drop detection signal may be provided, and the life end of the smoothing capacitor 4 may be annunciated when the voltage-drop detection signal becomes greater than a reference voltage within the counting time T. In this case, respective outputs of the comparators may be obtained in a three-stage manner according to an increase in the voltage drop of the smoothing capacitor 4 to perform a control in the same manner as that of the aforementioned lighting device.

While the present invention has been described in conjunction with specific embodiments thereof, various modifications and alterations will become apparent to those skilled in the art. Therefore, it is intended that the present invention is not limited to the illustrative embodiments herein, but only by the appended claims and their equivalents.

INDUSTRIAL APPLICABILITY

As mentioned above, the lighting device of the present invention is useful particularly in that a determination on a life end of a smoothing capacitor can be performed accurately in a simplified configuration even when a discharge lamp is constantly turned on, and suitable for use as a lighting device of a discharge lamp, such as a fluorescent lamp constituting an illumination apparatus or an illumination system.

The invention claimed is:

1. A discharge lamp lighting device, comprising:
   a DC power source circuit;
   a smoothing capacitor connected to an output end of the DC power source circuit;
   an inverter main circuit adapted to convert a DC power output from the smoothing capacitor, to an AC power, and supply the AC power to a discharge lamp;
   a main control circuit adapted to control the inverter main circuit so as to control the AC power to be supplied to the discharge lamp;
   a timer circuit adapted to count a predetermined time;
   a power supply suppression section adapted to voluntarily suppress power supplied to the smoothing capacitor during a period where the timer circuit counts the predetermined time in an ON state of the discharge lamp;
   a voltage/voltage drop detection section adapted to detect a voltage or a voltage drop of the smoothing capacitor at least during a period where the power supplied to the smoothing capacitor is suppressed;
   a first comparator adapted to compare between a detection value of the voltage or the voltage drop of the smoothing capacitor and a first threshold value to determine a life end of the discharge lamp, and output a result of the determination; and
   an auxiliary control circuit adapted to perform a control operation depending on the output of the first comparator.

2. The discharge lamp lighting device according to claim 1, which includes an annunciator adapted to be controlled depending on the output of the first comparator by the auxiliary control circuit, in such a manner as to annunciate a life end of the smoothing capacitor to the outside.

3. The discharge lamp lighting device according to claim 1, wherein the auxiliary control circuit is operable to control an operation of the main control circuit depending on the output of the first comparator.

4. The discharge lamp lighting device according to claim 1, which further includes a discharge-lamp-voltage detection section adapted to detect a discharge lamp voltage, wherein the timer circuit is designed such that the predetermined time to be counted is changed in response to a change in a detection value of the discharge lamp voltage.

5. The discharge lamp lighting device according to claim 4, wherein the timer circuit is designed such that the predetermined time to be counted becomes shorter as the detection value of the discharge lamp voltage becomes higher.

6. The discharge lamp lighting device according to claim 2, which further includes:
   a discharge-lamp-voltage detection section adapted to detect a discharge lamp voltage;
   a discharge-lamp-life determination section adapted to determine a life end of the discharge lamp based on a detection value of the discharge lamp voltage;
   a first additional annunciator adapted to annunciate the life end of the discharge lamp to the outside; and
   a second additional annunciator adapted to annunciate the life ends of both the smooth capacitor and the discharge lamp to the outside,
   wherein the auxiliary control circuit is operable to control each of said three annunciators based on the output of the first comparator and an output of the discharge-lamp-life determination section.

7. The discharge lamp lighting device according to claim 1, wherein:
   the DC power source circuit includes a step-up chopper circuit; and
   the power supply suppression section is operable to control a step-up operation of the step-up chopper circuit so as to suppress an output thereof to suppress the power supply to the smoothing capacitor.

8. The discharge lamp lighting device according to claim 1, which includes a discharge-lamp-voltage detection section adapted to detect a discharge lamp voltage, wherein said discharge lamp lighting device is designed such that a threshold value for use in the first comparator can be changed depending on a detection value of the discharge lamp voltage.

9. The discharge lamp lighting device according to claim 1, which is designed such that, when the first comparator compares between the detection value of the voltage of the smoothing capacitor and the first threshold value, the first threshold value becomes larger as a detection value of a discharge lamp voltage becomes higher, and, when the first comparator compares between the detection value of the voltage drop of the smoothing capacitor and the first threshold value, the first threshold value becomes smaller as the detection value of the discharge lamp voltage becomes higher.

10. The discharge lamp lighting device according to claim 1, wherein:
   the timer circuit is designed to start counting the predetermined time in response to a trigger signal from an external control system; and the auxiliary control circuit is operable to output a result of a determination on a life end of the smoothing capacitor to the external control system, depending on the output of the first comparator.

11. The discharge lamp lighting device according to claim 2, which further includes:
a second comparator adapted to compare between the detection value of the voltage or the voltage drop of the smoothing capacitor and a second threshold value, so as to output a result of the comparison; and
a third comparator adapted to compare between the detection value of the voltage or the voltage drop of the smoothing capacitor and a third threshold value, so as to output a result of the comparison,
whereby said first to third comparators can provide an output in a three-stage manner according to a decrease in the voltage of the smoothing capacitor or an increase in the voltage drop of the smoothing capacitor,
wherein the auxiliary control circuit is operable, in the first stage, to allow the annunciator to annunciate the life end of the smoothing capacitor to the outside, the auxiliary control circuit being operable, in the second stage, to control an operation of the main control circuit so as to controllably blink the discharge lamp, the auxiliary control circuit being operable, in the third stage, to control the operation of the main control circuit so as to turn off the discharge lamp.

12. An illumination apparatus equipped with the discharge lamp lighting device according to claim 1.

13. An illumination system equipped with the discharge lamp lighting device according to claim 1.

* * * * *